United States Patent
Zuiss et al.

(10) Patent No.: US 7,554,391 B1
(45) Date of Patent: Jun. 30, 2009

(54) AMPLIFIER HAVING A VIRTUAL GROUND AND METHOD THEREOF

(75) Inventors: Thomas J. Zuiss, Austin, TX (US); Kevin B. Traylor, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 12/013,070

(22) Filed: Jan. 11, 2008

(51) Int. Cl.
*H03F 3/38* (2006.01)

(52) U.S. Cl. .......................................... 330/10; 330/126
(58) Field of Classification Search .................. 330/10, 330/126, 251, 207 A
See application file for complete search history.

(56) References Cited

U.S. PATENT DOCUMENTS

| | | | |
|---|---|---|---|
| 1,797,746 A * | 3/1931 | Young | 455/101 |
| 3,039,062 A * | 6/1962 | Nessel | 330/84 |
| 3,162,730 A * | 12/1964 | Owen, Jr. | 369/88 |
| 3,394,235 A * | 7/1968 | Schott | 369/86 |
| 5,541,482 A | 7/1996 | Siao | |
| 5,796,302 A | 8/1998 | Masini et al. | |
| 6,091,292 A | 7/2000 | Higashiyama et al. | |
| 6,140,875 A | 10/2000 | Van Den Homberg et al. | |
| 6,166,596 A | 12/2000 | Higashiyama et al. | |
| 6,208,216 B1 | 3/2001 | Nasila | |
| 6,346,852 B1 | 2/2002 | Masini et al. | |
| 6,384,678 B2 | 5/2002 | Berkhout | |
| 6,441,685 B1 | 8/2002 | MacMillan | |
| 6,694,034 B2 | 2/2004 | Julstrom et al. | |
| 7,002,406 B2 | 2/2006 | Risbo et al. | |
| 7,068,104 B2 | 6/2006 | Burns et al. | |
| 7,092,691 B2 | 8/2006 | Bohn et al. | |
| 7,099,486 B2 | 8/2006 | Julstrom et al. | |
| 7,206,426 B1 | 4/2007 | Julstrom et al. | |
| 7,230,485 B2 | 6/2007 | De Cremoux et al. | |
| 2002/0014916 A1 | 2/2002 | Berkhout | |
| 2002/0180534 A1 | 12/2002 | Bohn et al. | |
| 2003/0044033 A1 | 3/2003 | Julstrom et al. | |
| 2003/0152243 A1 | 8/2003 | Julstrom et al. | |
| 2005/0017799 A1 | 1/2005 | Risbo et al. | |
| 2006/0006945 A1 | 1/2006 | Burns et al. | |
| 2006/0006950 A1 | 1/2006 | Burns et al. | |
| 2006/0077007 A1 | 4/2006 | De Cremoux et al. | |
| 2006/0269088 A1 | 11/2006 | Julstrom et al. | |
| 2007/0109029 A1 | 5/2007 | Stanley | |

* cited by examiner

*Primary Examiner*—Henry K Choe
(74) *Attorney, Agent, or Firm*—Daniel D. Hill

(57) ABSTRACT

An amplifier comprises first, second, and third modulators. The first modulator includes an input for receiving a first input signal, and an output for providing a first modulated output signal corresponding to the first input signal. The second modulator includes an input for receiving a second input signal, and an output for providing a second modulated output signal corresponding to the second input signal. The third modulator has an input for receiving a third input signal, and an output for providing a third modulated output signal corresponding to the third input signal and for providing a virtual ground. A first amplifier circuit is coupled to the outputs of the first and third modulators for driving a first load. A second amplifier circuit is coupled to the outputs of the second and third modulators for driving a second load.

20 Claims, 3 Drawing Sheets

AMPLIFIER HAVING A VIRTUAL GROUND AND METHOD THEREOF

BACKGROUND

1. Field

This disclosure relates generally to amplifiers, and more specifically, to an audio amplifier having a virtual ground.

2. Related Art

Traditional amplifiers, such as class D amplifiers used in audio applications use a system ground for coupling the amplifier to a load, such as a speaker, a headset, or an earphone. Use of the system ground requires the use of output coupling capacitors, which take up space. This poses problems for audio applications where space is limited, such as mobile devices. To address this problem, certain amplifiers use a differential output, which removes the need for a coupling capacitor. The use of differential output, however, results in two pins for coupling to the speaker, the headset, or the earphone. Moreover, stereo amplifiers need four pins for coupling to the speaker, the headset, or the earphone, when using differential output. This poses problems where there is a paucity of pins that can be used to couple to such loads. One way to reduce the number of pins in such amplifiers is to use a virtual ground. The stereo amplifiers that do use a virtual ground typically use a linear regulator to produce the virtual ground. The use of the linear regulator, however, results in lower efficiency. Moreover, in a class D audio amplifier, the linear regulator does not track changes in the supply voltage to the amplifier.

Accordingly, there is a need for an improved audio amplifier having a virtual ground.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
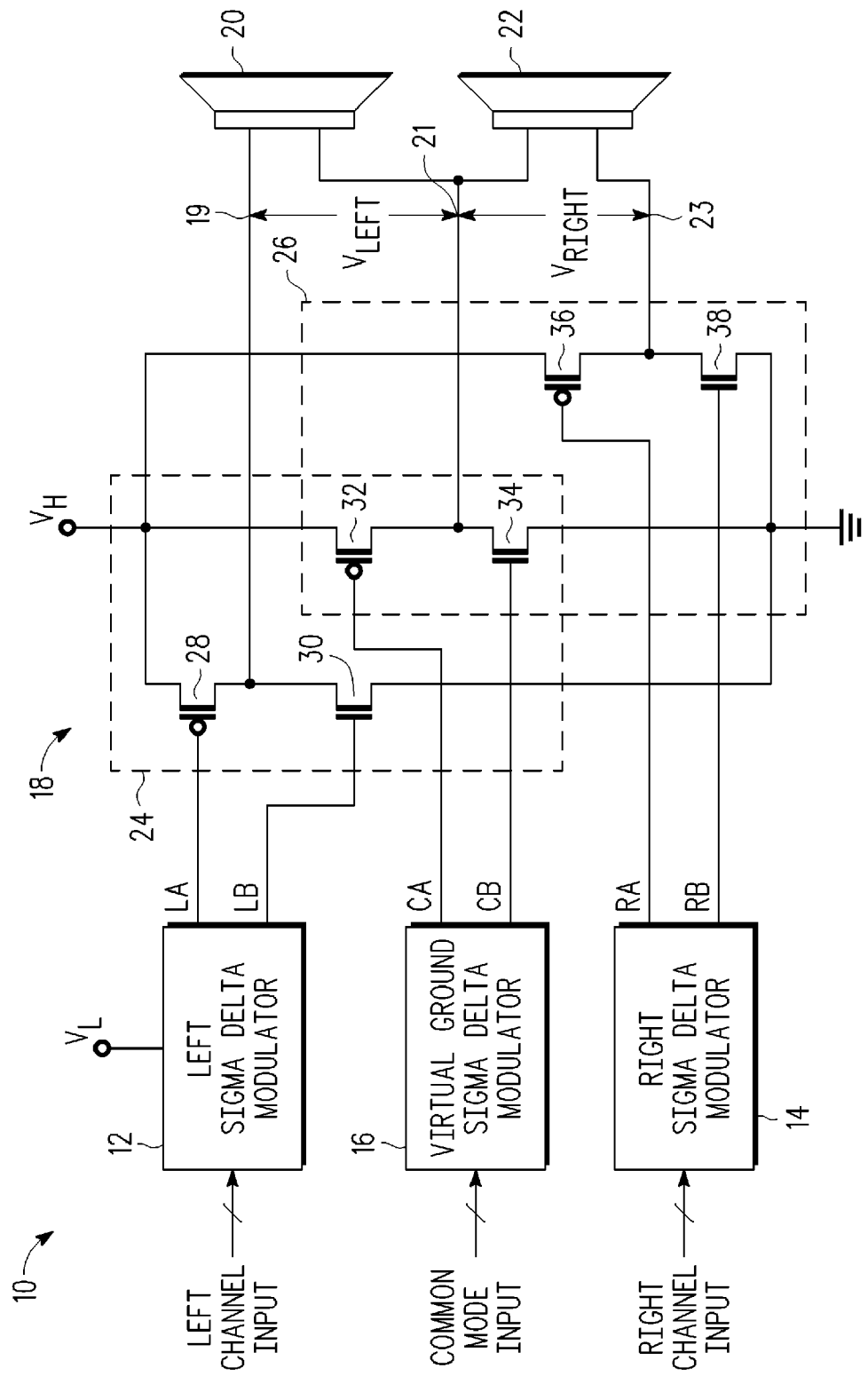
FIG. 1 shows an exemplary amplifier with a virtual ground.

In one aspect, an amplifier is provided. The amplifier includes a first modulation circuit having an input for receiving a first input signal, and an output for providing a first modulated output signal, the first modulated output signal corresponding to the first input signal. The amplifier further includes a second modulation circuit having an input for receiving a second input signal, and an output for providing a second modulated output signal, the second modulated output signal corresponding to the second input signal. The amplifier further includes a third modulation circuit having an input for receiving a third input signal, and an output for providing a third modulated output signal, the third modulated output signal corresponding to the third input signal and for providing a virtual ground. The amplifier further includes a first amplifier circuit coupled to the outputs of the first and third modulation circuits, the first amplifier circuit for driving a first load. The amplifier further includes a second amplifier circuit coupled to the outputs of the second and third modulation circuits, the second amplifier circuit for driving a second load.

In another aspect, an amplifier is provided. The amplifier includes a first sigma delta modulator having an input for receiving a first input signal, and an output for providing a first pulse density modulated output signal, the first pulse density modulated output signal corresponding to the first input signal. The amplifier further includes a second sigma delta modulator having an input for receiving a second input signal, and an output for providing a second pulse density modulated output signal, the second pulse density modulated output signal corresponding to the second input signal. The amplifier further includes a third sigma delta modulator having an input for receiving a third input signal, and an output for providing a third pulse density modulated output signal, the third pulse density modulated output signal corresponding to the third input signal and for providing a virtual ground. The amplifier further includes a first H-bridge circuit coupled to the outputs of the first and third sigma delta modulators, the first H-bridge circuit for driving a first load. The amplifier further includes a second H-bridge circuit coupled to the outputs of the second and third sigma delta modulators, the second H-bridge circuit for driving a second load.

In yet another aspect, method for amplifying first and second stereo audio signals is provided. The method includes modulating the first stereo audio signal to provide a first modulated stereo signal. The method further includes modulating the second stereo audio signal to provide a second modulated stereo signal. The method further includes modulating a third signal to provide a third modulated signal, the third modulated signal for providing a virtual ground. The method further includes amplifying the first modulated stereo signal to drive a first load, wherein the first load is coupled to receive the first modulated stereo signal and the virtual ground. The method further includes amplifying the second modulated stereo signal to drive a second load, wherein the second load is coupled to receive the second modulated stereo signal and the virtual ground.

As used herein the term "virtual ground" includes, but is not limited to, a point that has no real electrical connection to a system ground or a real ground, but instead is a point that is being held close to the amplifier's system ground or the real ground.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

FIG. 1 shows an exemplary amplifier 10 with a virtual ground. In one embodiment, amplifier 10 may be a class D amplifier. By way of example, amplifier 10 may include left sigma delta modulator 12, right sigma delta modulator 14, virtual ground sigma delta modulator 16, and output circuit 18. Amplifier 10 may be coupled to left speaker 20 and right speaker 22. Left sigma delta modulator 12, right sigma delta modulator 14, and virtual ground sigma delta modulator 16 may receive a voltage $V_L$. Output circuit 18 may receive a voltage $V_H$, where $V_H$ is greater than $V_L$. Left sigma delta modulator 12 may receive LEFT CHANNEL INPUT, which corresponds to digital bits representing content, such as audio content, destined for left speaker 20. Right sigma delta modulator 14 may receive RIGHT CHANNEL INPUT, which corresponds to digital bits representing content, such as audio content, destined for right speaker 22. Virtual ground sigma delta modulator may receive COMMON MODE INPUT, which may correspond to a common mode voltage. Left sigma delta modulator 12 may generate signals LA and LB. Signals LA and LB may be single ended two level signals. Signals LA and LB may be pulse density modulated representations of LEFT CHANNEL INPUT. Right sigma delta modulator 14 may generate signals RA and RB. Like signals LA and LB, signals RA and RB may be singled ended two level signals. Signals RA and RB may be pulse density modulated representations of RIGHT CHANNEL INPUT. In one embodiment, each input signal (LEFT CHANNEL INPUT and RIGHT CHANNEL INPUT, for example) is converted to a sequence of pulses whose averaged value is directly proportional to the instantaneous amplitude of the input signal.

Referring still to FIG. 1, Virtual ground sigma delta modulator 16 may generate signals CA and CB. Like signals LA, LB, RA, and RB, signals CA and CB may be single ended two level signals. In one embodiment, signals CA and CB may be square wave signals. Although FIG. 1 shows sigma delta modulators, amplifier 10 may include other types of modulation circuits. For example, instead of sigma delta modulation, pulse width modulation may be used. In that case, signals LA and LB may be pulse width modulated representations of LEFT CHANNEL INPUT. Similarly, signals RA and RB may be pulse width modulated representations of RIGHT CHANNEL INPUT. Although FIG. 1 shows a specific number of components arranged in a specific manner, amplifier 10 may include fewer or additional components, which may be arranged differently. By way of example, amplifier 10 may include additional sigma delta modulators for receiving inputs from additional audio content.

Referring still to FIG. 1, output circuit 18 may include two H-bridges 24 and 26 (also, referred to as amplifier circuits). H-bridges 24 and 26 may function as current amplifiers. H-bridge 24 may include a p-MOS transistor 28, an n-MOS transistor 30, a p-MOS transistor 32, and an n-MOS transistor 34. A current electrode of transistor 28 and a current electrode of transistor 32 may be coupled to receive voltage $V_H$. A current electrode of transistor 30 and a current electrode of transistor 34 may be coupled to ground. A control electrode of transistor 28 may be coupled to receive signal LA. A control electrode of transistor 30 may be coupled to receive signal LB. A control electrode of transistor 32 may be coupled to receive signal CA. A control electrode of transistor 34 may be coupled to receive signal CB. In operation, H-bridge 24 may current amplify the single ended signals LA and LB. In addition, H-bridge 24 may current amplify signals CA and CB. H-bridge 26 may include a p-MOS transistor 36, an n-MOS transistor 38 and may share transistors 32 and 34 with H-bridge 24. A current electrode of transistor 36 may be coupled to receive voltage $V_H$. A current electrode of transistor 38 may be coupled to ground. A control electrode of transistor 36 may be coupled to receive signal RA. A control electrode of transistor 38 may be coupled to receive signal RB. In operation, H-bridge 26 may current amplify the single ended signals RA and RB. In addition, H-bridge 26 may current amplify signals CA and CB. Although FIG. 1 shows a specific number of transistors as part of H-bridges 24 and 26, they may include additional transistors.

Figure 2:
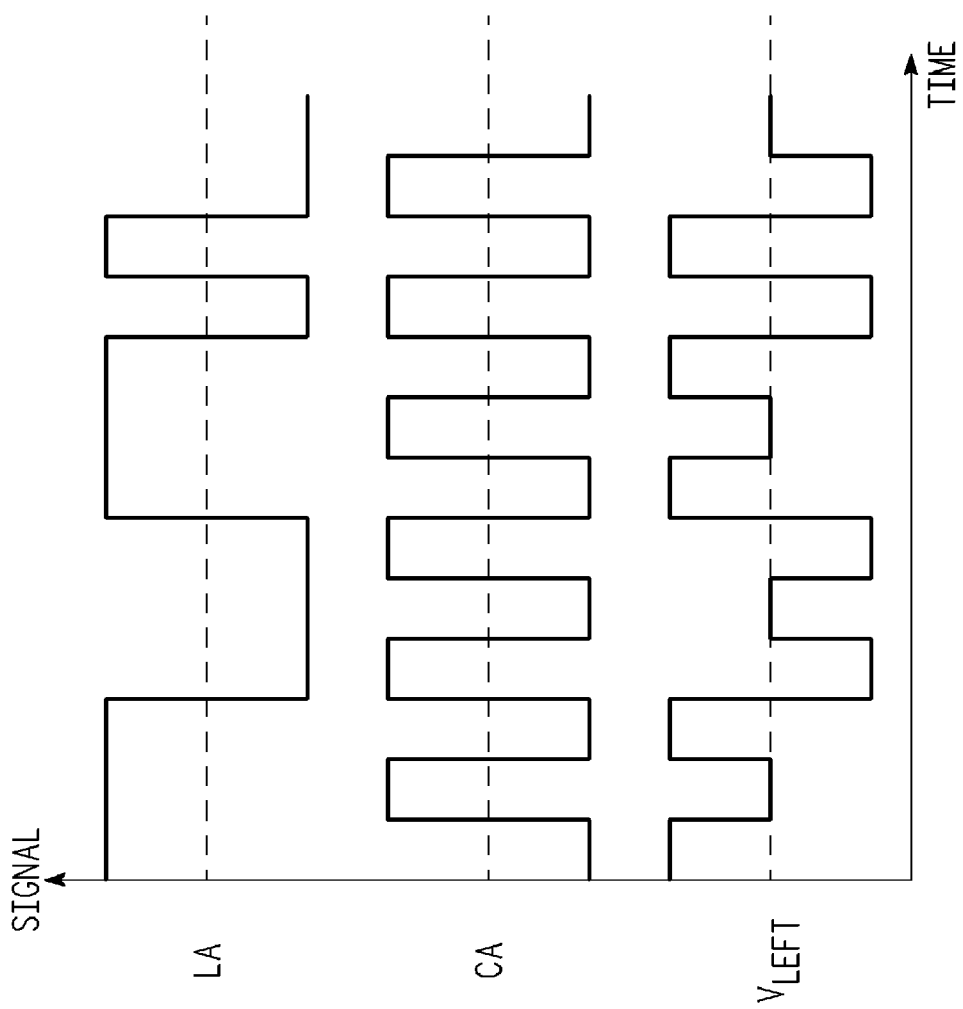
FIG. 2 shows signals for the exemplary amplifier of FIG. 1.

FIG. 2 shows signals for the exemplary amplifier of FIG. 1. Signal LA, output by left sigma delta modulator 12, may be a single ended two level signal. Also, signal CA, output by virtual ground sigma delta modulator 16 may be a square wave signal. Voltage $V_{LEFT}$, a voltage that appears across the terminals to which speaker 20 is coupled, is a function of signals LA and CA. In one embodiment, $V_{LEFT}$ voltage is representative of a difference between signals LA and CA. Thus, for example, when signal LA is high and signal CA is low, then voltage $V_{LEFT}$ is high. When signal LA is still high, but signal CA is also high, then voltage $V_{LEFT}$ is close to zeros. When signal LA is low and signal CA is still high, then voltage $V_{LEFT}$ is low. The variation in voltage $V_{LEFT}$ results in current variation through speaker 20, which is representative of the signal received via LEFT CHANNEL INPUT. Although not shown in FIG. 2, Signal RA, output by right sigma delta modulator 14, may be a single ended two level signal. Voltage $V_{RIGHT}$, a voltage that appears across the terminals to which speaker 22 is coupled, is a function of signals RA and CA. In one embodiment, $V_{RIGHT}$ voltage is representative of a difference between signals RA and CA. Thus, for example, when signal RA is high and signal CA is low, then voltage $V_{RIGHT}$ is high. When signal RA is still high, but signal CA is also high, then voltage $V_{RIGHT}$ is close to zeros. When signal RA is low and signal CA is still high, then voltage $V_{RIGHT}$ is low. The variation in voltage $V_{RIGHT}$ results in current variation through speaker 22, which is representative of the signal received via RIGHT CHANNEL INPUT.

Figure 3:
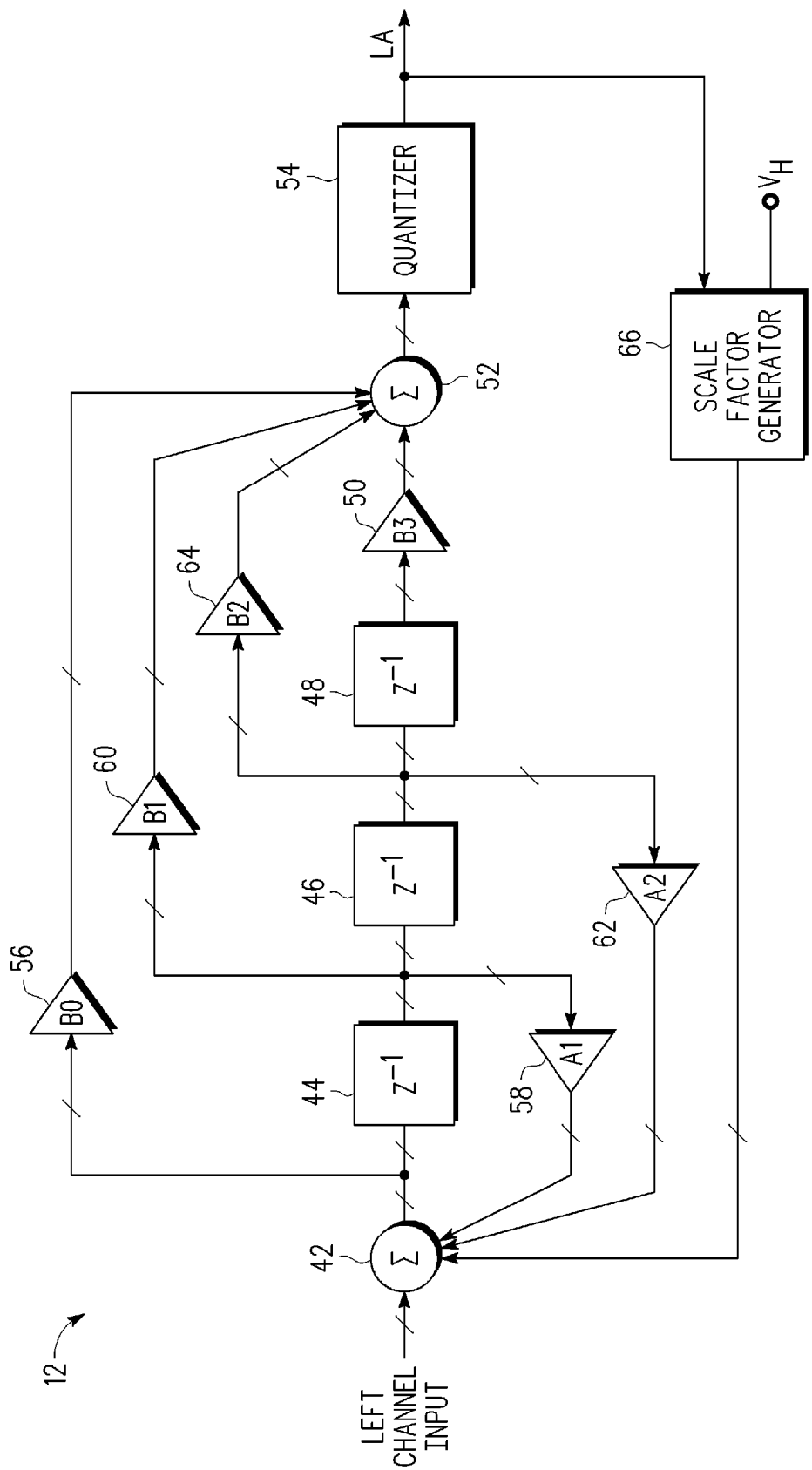
FIG. 3 shows an exemplary sigma delta modulator for the exemplary amplifier of FIG. 1.

FIG. 3 shows an exemplary left sigma delta modulator 12 for the exemplary amplifier of FIG. 1. Right sigma delta modulator 14 and virtual ground sigma delta modulator 16 may have similar components, as shown for left sigma delta modulator 12. Left sigma delta modulator 12 may include a summers 42 and 52, delay elements 44, 46, and 48, gain stages 50 (labeled as B3 in FIG. 3), 56 (labeled as B0 in FIG. 3), 58 (labeled as A1 in FIG. 3), 60 (labeled as B1 in FIG. 3), 62 (labeled as A2 in FIG. 3), and 64 (labeled as B2 in FIG. 3), quantizer 54, and scale factor generator 66. Summer 42 may receive LEFT CHANNEL INPUT, a feed back signal received via gain stage 58, a feed back signal received via gain stage 62, and an output of scale factor generator 66. Summer 42 may sum these signals. The output of summer 42 may be coupled to an input of delay element 44 and to summer 52 via gain stage 56. The output of delay element 44 may be coupled to an input of gain stage 58, to an input of gain stage 60, and to an input of delay element 46. The output of delay element 46 may be coupled to an input of gain stage 62, to an input of gain stage 64, and to an input of delay element 48. The output of delay element 48 may be coupled to an input of summer 52. Summer 52 may sum the signals received as inputs. The output of summer 52 may be coupled as an input to quantizer 54. Quantizer 54 transforms a multi-valued input to a two valued output. Signal LA is a function of LEFT CHANNEL INPUT and delayed versions of it. Each gain stage generates a multiplied version of its input signal based on a gain coefficient associated with the gain stage. Gain coefficients could be fixed or variable. Scale factor generator 66 may receive voltage $V_H$. Gain states 56, 60, and 64 provide a feed-forward signal, whereas gain stages 58 and 62 provide a feedback signal. Scale factor generator 66 may adjust a value of LA signal in response to variations in voltage $V_H$. In one embodiment, scale factor generator 66 inverts a digital representation of voltage $V_H$ when signal LA is negative. On the other hand, when signal LA is positive, scale factor generator does not invert the digital representation of voltage $V_H$ and simply passes it to summer 42. Although FIG. 3 shows a specific number of components arranged in a specific manner, left sigma delta modulator 12 and other sigma delta modulators described herein may include additional or fewer components, which may be arranged differently. By way of example, left sigma delta modulator 12 may include additional or fewer gain stages and/or delay elements.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different processing systems. For example, although FIG. 1 and the discussion thereof describe an exemplary amplifier architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An amplifier comprising:
    a first modulation circuit having an input for receiving a first input signal, and an output for providing a first modulated output signal, the first modulated output signal corresponding to the first input signal;
    a second modulation circuit having an input for receiving a second input signal, and an output for providing a second modulated output signal, the second modulated output signal corresponding to the second input signal;
    a third modulation circuit having an input for receiving a third input signal, and an output for providing a third modulated output signal, the third modulated output signal corresponding to the third input signal and for providing a virtual ground;
    a first amplifier circuit coupled to the outputs of the first and third modulation circuits, the first amplifier circuit for driving a first load; and
    a second amplifier circuit coupled to the outputs of the second and third modulation circuits, the second amplifier circuit for driving a second load.

2. The amplifier of claim 1, wherein the first amplifier circuit comprises a first H-bridge circuit and the second amplifier circuit comprises a second H-bridge circuit.

3. The amplifier of claim 1, wherein the third input signal represents a common mode voltage.

4. The amplifier of claim 1, wherein the first, second, and third modulation circuits are characterized as being sigma delta modulation circuits.

5. The amplifier of claim 4, wherein each of the sigma delta modulation circuits comprises:
- a first summer having a first input for receiving the first input signal, a second input for receiving a feedback signal, and an output;
- a delay element having an input coupled to the output of the first summer, and an output for providing the feedback signal;
- a gain stage having an input coupled to the output of the delay element, and an output;
- a second summer having a first input coupled to the output of the gain stage, a second input for receiving a feedforward signal from the output of the first summer, and an output; and
- a quantizer having an input coupled to the output of the second summer, and an output.

6. The amplifier of claim 5, wherein each of the sigma delta modulation circuits further comprises a scale factor generator having a first input coupled to the output of the quantizer, a second input coupled to receive a power supply voltage, and an output coupled to a third input of the first summer, wherein the scale factor generator adds a scale factor to the first summer to compensate for variations of the power supply voltage.

7. The amplifier of claim 1, wherein the amplifier is characterized as being a class D amplifier and the first, second, and third input signals are digital signals.

8. The amplifier of claim 1, wherein the first, second, and third modulated output signals are characterized as being pulse density modulated output signals.

9. The amplifier of claim 1, wherein the first amplifier circuit comprises a pair of series-connected transistors coupled between a power supply terminal and a ground terminal, the pair of series-connected transistors coupled to receive the first modulated output signal, and in response, to provide an amplified modulated output signal.

10. The amplifier of claim 1, wherein the first amplifier circuit comprises a first H-bridge circuit and the second amplifier circuit comprises a second H-bridge circuit, wherein:
- the first H-bridge circuit has a first input coupled to the output of the first modulation circuit and a second input coupled to the output of the third modulation circuit, the first H-bridge circuit having an output for driving the first load; and
- the second H-bridge circuit has a first input coupled to the output of the second modulation circuit and a second input coupled to the output of the third modulation circuit, the second H-bridge circuit having an output for driving the second load.

11. An amplifier comprising:
- a first sigma delta modulator having an input for receiving a first input signal, and an output for providing a first pulse density modulated output signal, the first pulse density modulated output signal corresponding to the first input signal;
- a second sigma delta modulator having an input for receiving a second input signal, and an output for providing a second pulse density modulated output signal, the second pulse density modulated output signal corresponding to the second input signal;
- a third sigma delta modulator having an input for receiving a third input signal, and an output for providing a third pulse density modulated output signal, the third pulse density modulated output signal corresponding to the third input signal and for providing a virtual ground;
- a first H-bridge circuit coupled to the outputs of the first and third sigma delta modulators, the first H-bridge circuit for driving a first load; and
- a second H-bridge circuit coupled to the outputs of the second and third sigma delta modulators, the second H-bridge circuit for driving a second load.

12. The amplifier of claim 11, wherein the third input signal represents a common mode voltage of the first and second input signals.

13. The amplifier of claim 11, wherein the first and second input signals are digital audio signals and each of the first and second loads is a speaker.

14. The amplifier of claim 11, wherein the each of the first, second, and third sigma delta modulators comprises:
- a first summer having a first input for receiving the first input signal, a second input for receiving a feedback signal, and an output;
- a delay element having an input coupled to the output of the first summer, and an output for providing the feedback signal;
- a gain stage having an input coupled to the output of the delay element, and an output;
- a second summer having a first input coupled to the output of the gain stage, a second input for receiving a feedforward signal from the output of the first summer, and an output; and
- a quantizer having an input coupled to the output of the second summer, and an output.

15. The amplifier of claim 14, wherein each of the first, second, and third sigma delta modulators further comprises a scale factor generator having a first input coupled to the output of the quantizer, a second input coupled to receive a power supply voltage, and an output coupled to a third input of the first summer, wherein the scale factor generator adds a scale factor to the first summer to compensate for variations of the power supply voltage.

16. A method for amplifying first and second stereo audio signals, the method comprising:
- modulating the first stereo audio signal to provide a first modulated stereo signal;
- modulating the second stereo audio signal to provide a second modulated stereo signal;
- modulating a third signal to provide a third modulated signal, the third modulated signal for providing a virtual ground;
- amplifying the first modulated stereo signal to drive a first load, wherein the first load is coupled to receive the first modulated stereo signal and the virtual ground; and
- amplifying the second modulated stereo signal to drive a second load, wherein the second load is coupled to receive the second modulated stereo signal and the virtual ground.

17. The method of claim 16, wherein modulating the first stereo audio signal, modulating the second stereo audio signal, and modulating the third signal each further comprise pulse density modulating each of the first stereo audio signal, the second stereo audio signal, and the third signal.

18. The method of claim 16, wherein modulating the third signal further comprises providing a third signal that represents a common mode between the first and second stereo audio signals.

19. The method of claim 16, wherein modulating the first stereo audio signal further comprises:

using a first summer, summing the first stereo audio signal input with a feedback signal to produce a summation signal;

delaying the first summation signal to generate a delayed summation signal;

feeding back the delayed summation signal to the first summer;

amplifying the delayed summation signal;

using a second summer, summing the delayed summation signal with a feed-forward signal from the first summer to produce a second summation signal; and quantizing the second summation signal to produce a quantized signal.

20. The method of claim 19, further comprising:

coupling the quantized signal to an input of a scale factor generator; and feeding back an output of the scale factor generator to the first summer, wherein the scale factor generator adds a scale factor to the first summer to compensate for variations of the power supply voltage.

* * * * *